United States Patent
Taniyama et al.

(10) Patent No.: US 11,139,188 B2
(45) Date of Patent: Oct. 5, 2021

(54) GAS SUPPLY DEVICE, METHOD FOR CONTROLLING GAS SUPPLY DEVICE, LOAD PORT, AND SEMICONDUCTOR MANUFACTURING APPARATUS

(71) Applicant: SINFONIA TECHNOLOGY CO., LTD., Tokyo (JP)

(72) Inventors: Yasushi Taniyama, Tokyo (JP); Toshimitsu Morihana, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 335 days.

(21) Appl. No.: 15/961,395

(22) Filed: Apr. 24, 2018

(65) Prior Publication Data

US 2018/0315632 A1 Nov. 1, 2018

(30) Foreign Application Priority Data

Apr. 28, 2017 (JP) .............................. JP2017-090618
Apr. 6, 2018 (JP) .............................. JP2018-074003

(51) Int. Cl.
*H01L 21/673* (2006.01)
*H01L 21/677* (2006.01)

(52) U.S. Cl.
CPC .. *H01L 21/67389* (2013.01); *H01L 21/67393* (2013.01); *H01L 21/67775* (2013.01); *H01L 21/67772* (2013.01)

(58) Field of Classification Search
None
See application file for complete search history.

(56) References Cited

U.S. PATENT DOCUMENTS

| | | | | |
|---|---|---|---|---|
| 5,482,161 A | * | 1/1996 | Williams | .......... H01L 21/67369 206/711 |
| 5,810,062 A | * | 9/1998 | Bonora | ............. H01L 21/67393 141/351 |
| 5,879,458 A | * | 3/1999 | Roberson, Jr. | .... H01L 21/67017 118/715 |
| 5,988,233 A | * | 11/1999 | Fosnight | ........... H01L 21/67393 141/63 |
| 6,056,026 A | * | 5/2000 | Fosnight | ................. F16K 51/02 141/98 |

(Continued)

FOREIGN PATENT DOCUMENTS

JP 2015-88500 A 5/2015

*Primary Examiner* — Daphne M Barry
(74) *Attorney, Agent, or Firm* — Westerman, Hattori, Daniels & Adrian, LLP

(57) ABSTRACT

A purging nozzle unit of a gas supply device according to the present invention including: a housing that is capable of passing a predetermined gas so as to replace the internal atmosphere of a FOUP with the predetermined gas; a nozzle coming into intimate contact with the proximity of a port that is provided on one face of the FOUP, the nozzle being pressed to thereby open the port; an operation adjustment space configured to increase or decrease so as to operate the nozzle between a use posture in which the predetermined gas can be supplied into the target container via the port and a standby posture in which the predetermined gas cannot be supplied into the target container via the port; and a gas introducing part configured to export or import compression air relative to the operation adjustment space to thereby control an operation of the nozzle.

18 Claims, 11 Drawing Sheets

(56) References Cited

U.S. PATENT DOCUMENTS

| | | | | |
|---|---|---|---|---|
| 6,164,664 A * | 12/2000 | Fosnight | ............ | F16J 15/025 277/635 |
| 6,187,182 B1 * | 2/2001 | Reynolds | ............ | B01D 46/0004 210/136 |
| 6,199,604 B1 * | 3/2001 | Miyajima | ............ | H01L 21/67017 141/348 |
| 6,641,349 B1 * | 11/2003 | Miyajima | ............ | H01L 21/67126 206/711 |
| 7,328,727 B2 * | 2/2008 | Tieben | ............ | H01L 21/67379 141/11 |
| 7,400,383 B2 * | 7/2008 | Halbmaier | ............ | H01L 21/67389 206/449 |
| 8,061,738 B2 * | 11/2011 | Okabe | ............ | F16J 15/002 15/301 |
| 8,091,592 B2 * | 1/2012 | Sato | ............ | F16K 15/063 137/540 |
| 8,146,623 B2 * | 4/2012 | Tieben | ............ | H01L 21/67017 141/286 |
| 9,895,723 B2 * | 2/2018 | Iwamoto | ............ | B08B 5/00 |
| 9,916,997 B2 * | 3/2018 | Morihana | ............ | H01L 21/67393 |
| 9,997,388 B2 * | 6/2018 | Smith | ............ | B65D 85/38 |
| 10,014,200 B2 * | 7/2018 | Murata | ............ | H01L 21/67745 |
| 10,217,656 B2 * | 2/2019 | Murata | ............ | H01L 21/67393 |
| 2006/0288664 A1 * | 12/2006 | Okabe | ............ | H01L 21/67763 53/510 |
| 2008/0260498 A1 * | 10/2008 | Nagata | ............ | H01L 21/67017 414/217 |
| 2010/0163452 A1 * | 7/2010 | Lin | ............ | H01L 21/67393 206/711 |
| 2011/0214778 A1 * | 9/2011 | Natsume | ............ | H01L 21/67775 141/4 |
| 2012/0309286 A1 * | 12/2012 | Nakano | ............ | H01L 21/67389 454/305 |
| 2013/0326841 A1 * | 12/2013 | Natsume | ............ | H01L 21/67775 15/405 |
| 2017/0025299 A1 * | 1/2017 | Sasaki | ............ | H01L 21/67772 |
| 2019/0326134 A1 * | 10/2019 | Suzuki | ............ | H01L 21/67766 |

* cited by examiner

GAS SUPPLY DEVICE, METHOD FOR CONTROLLING GAS SUPPLY DEVICE, LOAD PORT, AND SEMICONDUCTOR MANUFACTURING APPARATUS

CROSS-REFERENCE TO RELATED APPLICATIONS

This application claims priority of Japanese Patent Applications No. 2017-090618 filed on Apr. 28, 2017 and No. 2018-074003 filed on Apr. 6, 2018. The contents of the applications are incorporated herein by reference in their entirety.

BACKGROUND OF THE INVENTION

1. Field of the Invention

The present invention relates to a gas supply device for supplying predetermined gas to a target container having a target space, a method for controlling the gas supply device, a load port, and a semiconductor manufacturing apparatus.

2. Description of the Related Art

Conventionally, in a semiconductor manufacturing process, for the sake of improvement of yields or quality, wafer processing has been carried out in a clean room. In recent years, as an essential device for more remarkably improving a degree of cleanliness only in a local space at the periphery of a wafer, there has been utilized a storage container referred to as a FOUP (Front-Opening Unified Pod) that is a target container for conveying and maintaining a wafer in a predetermined environment with a high degree of cleanliness; and a load port that is a device of an interface section, the load port being configured to export or import the wafer in the FOUP relative to the semiconductor manufacturing apparatus and carry out delivery of the FOUP relative to a conveying device.

In the meanwhile, while the inside of the semiconductor manufacturing apparatus is maintained in a predetermined gas atmosphere that is suitable for wafer processing or machining, when a wafer is sent out from the inside of the FOUP into the semiconductor manufacturing apparatus, it follows that an internal space of the FOUP and an internal space of the semiconductor manufacturing apparatus communicates with each other. Therefore, if the environment of the inside of the FOUP has a lower degree of cleanliness than that of the inside of the semiconductor manufacturing apparatus, the gas contained in the FOUP gets into the semiconductor manufacturing apparatus, and may adversely influence the gas atmosphere in the semiconductor manufacturing apparatus.

As a technique for coping with such a problem, there is conventionally disclosed a load port provided with a purging device configured to charge and fill a predetermined gas (such as nitrogen gas, dry air or inert gas, for example) from a bottom face side into the FOUP while the FOUP in which a wafer has been housed is placed on a placement base of the load port and then replace the internal atmosphere of the FOUP with a predetermined gas atmosphere. A so called bottom purging approach of charging the predetermined gas such as nitrogen gas, dry air or inert gas from the bottom face side of the FOUP into the FOUP and then replacing the internal atmosphere of the FOUP with the predetermined atmosphere, as described above, has an advantage that the arrival concentration of the predetermined gas atmosphere is higher in comparison with that of the purging device of a front purging approach.

In addition, in Japanese Unexamined Patent Application Publication No. 2015-88500, there is disclosed a load port provided with a purging device configured to operate a valve provided in a FOUP that is a target container, by utilizing a kind of gas (such as compression air) other than a predetermined gas in order to blow the predetermined gas (such as nitrogen gas or inert gas, for example) into the FOUP.

However, the conventional purging device has been structured in such a manner as to operate the valve provided in the FOUP that is the target container by utilizing the pressure of the predetermined gas in order to open the aperture part of the FOUP. Thus, a dispersion occurs in amount of supply per unit time depending on whatsoever the pressure of the predetermined gas may be, and as a result, it may be difficult to maintain the inside of the FOUP so that the predetermined gas atmosphere is high in a predetermined working time, and there has been a disadvantage that the arrival concentration of the predetermined gas atmosphere is low.

The present invention has been made in order to cope with the situation as described above, and it is a main object of the present invention to provide a gas supply device that is capable of replacing the internal atmosphere of the target container with a predetermined gas at a higher efficiency; a method for controlling the gas supply device; a load port provided with the gas supply device, and a semiconductor manufacturing apparatus provided with the load port.

SUMMARY OF THE INVENTION

In view of the problem as described above, the present invention takes technical means as summarized below.

In other words, according to an aspect of the present invention, there is provided a gas supply device including: a housing structure division that is capable of passing a predetermined gas so as to supply the gas into a target container; a nozzle structure division having: a nozzle section configured to come into contact with a port section that is provided on one face of the target container, the port section including an opening/closing mechanism therein; and a pressing part configured to open the opening/closing mechanism; and an operation adjustment space being adapted to increase or decrease so as to operate the nozzle structure division between a use posture in which the predetermined gas can be supplied into the target container via the port section and a standby posture in which the predetermined gas cannot be supplied into the target container via the port section.

With such characterizing features, the nozzle structure division is operated regardless of whatsoever the pressure of the predetermined gas to be supplied to the target container may be, so that the predetermined gas can be preferably introduced into the target container. Also, the nozzle structure division is configured not only to open the port section but also to come into intimate contact with the proximity of the port section to thereby efficiently avoid leakage of the predetermined gas to the outside, so that the predetermined gas can be efficiently introduced into the target container. As a result, according to the present invention, a gas supply device that is capable of replacing the internal atmosphere of the target container with the predetermined gas at a higher efficiency.

As a specific construction that is capable of replacing the internal atmosphere of the target container with the predetermined gas at a high efficiency, there can be exemplified a construction in which the nozzle section comes into intimate contact with an outer edge of the port section that is provided on one face of the target container to thereby prevent the leakage of the gas contained in the target container to the outside, and the pressing part has: a pressing face configured to press the opening/closing mechanism; and an injecting part configured to inject the predetermined gas so as to be supplied into the target container.

Also, as a characterizing feature of an operation adjustment space for more efficiently replacing the gas contained in the target container with the predetermined gas, there can be exemplified a characterizing feature in which the operation adjustment space has: a first operation adjustment space provided between the housing structure division and the nozzle section, the first operation adjustment space being adapted to increase or decrease so as to operate the nozzle section between an intimate posture in which the nozzle section is brought into intimate contact with the outer edge of the port section and a spaced posture in which the nozzle section and the port section are spaced from each other from the intimate contact posture; and a second operation adjustment space provided between the nozzle section and the pressing part, the second operation adjustment space being adapted to increase or decrease so as to operate the pressing part between a closed posture in which the pressing part is spaced from the port section to thereby close off the port section and an open posture in which the pressing part presses the port section to thereby open the port section.

In addition, according to an aspect of the present invention, there is provided a specific method for controlling a gas supply device, for more efficiently replacing the gas contained in the target container with the predetermined gas, the gas supply device including: a housing structure division that is capable of passing a predetermined gas so as to replace the internal atmosphere of a target container with the predetermined gas; a nozzle section configured to come into intimate contact with an outer edge of a port section that is provided on one face of the target container to thereby prevent leakage of the gas contained in the target container to an outside; a pressing part having: a pressing face configured to press the port section; and an injecting part configured to inject the predetermined gas into the target container; a first operation adjustment space provided between the housing structure division and the nozzle section, the first operation adjustment space being adapted to increase or decrease so as to operate the nozzle section between an intimate contact posture in which the nozzle section is brought into intimate contact with the outer edge of the port section and a spaced posture in which the nozzle section and the port section are spaced from each other from the intimate contact posture; and a second operation adjustment space provided between the nozzle section and the pressing part, the second operation adjustment space being adapted to increase or decrease so as to operate the pressing part between a closed posture in which the pressing part is spaced from the port section to thereby close off the port section and an open posture in which the pressing part presses the port section to thereby open the port section, the method including exporting or importing the control gas relative to the first operation adjustment space and the second operation adjustment space to thereby control an operation of the nozzle section and the pressing part.

Further, in order to control the operation of the nozzle section and the pressing part with a simpler construction, it is desirable that the control gas be directly exported or imported relative to the first operation adjustment space and a communication path configured to cause the first operation adjustment space and the second operation adjustment space to communicate with each other be further provided so as to be thereby able to increase or decrease the second operation adjustment space as well.

Furthermore, in order to more efficiently control the operation of the nozzle section and the pressing part, it is desirable that the communication path be configured to operate the nozzle section toward the intimate contact posture at which the nozzle section comes into intimate contact with the outer edge of the port section and then operate the pressing part toward the open posture.

Still furthermore, as an example in which the gas supply device as described above can be efficiently utilized, there can be exemplified a load port characterized by including the gas supply device in plurality, wherein the gas atmosphere in the target container can be replaced with nitrogen or dry air while the pressing part of the gas supply device is caused to communicate with each of a plurality of port sections that are provided on a bottom face of the target container.

Yet furthermore, the present invention is applied to a semiconductor manufacturing apparatus that comprises the gas supply device. In the semiconductor manufacturing apparatus, the target container, wherein a wafer stored in the FOUP is exported or imported via a conveyance inlet formed on a front face of the target container. The semiconductor manufacturing apparatus can obtain the advantageous effect of the present invention.

According to the first aspect or the second aspect of the present invention described hereinabove, it may be possible to provide a gas supply device that is capable of replacing a internal atmosphere of a target container with a predetermined gas at a higher efficiency; the method for controlling the gas supply device; the load port provided with the gas supply device, and the semiconductor manufacturing apparatus provided with the load port.

DETAILED DESCRIPTION OF THE EMBODIMENTS

Hereinafter, an embodiment of the present invention will be described with reference to the accompanying drawings.

Figure 1:
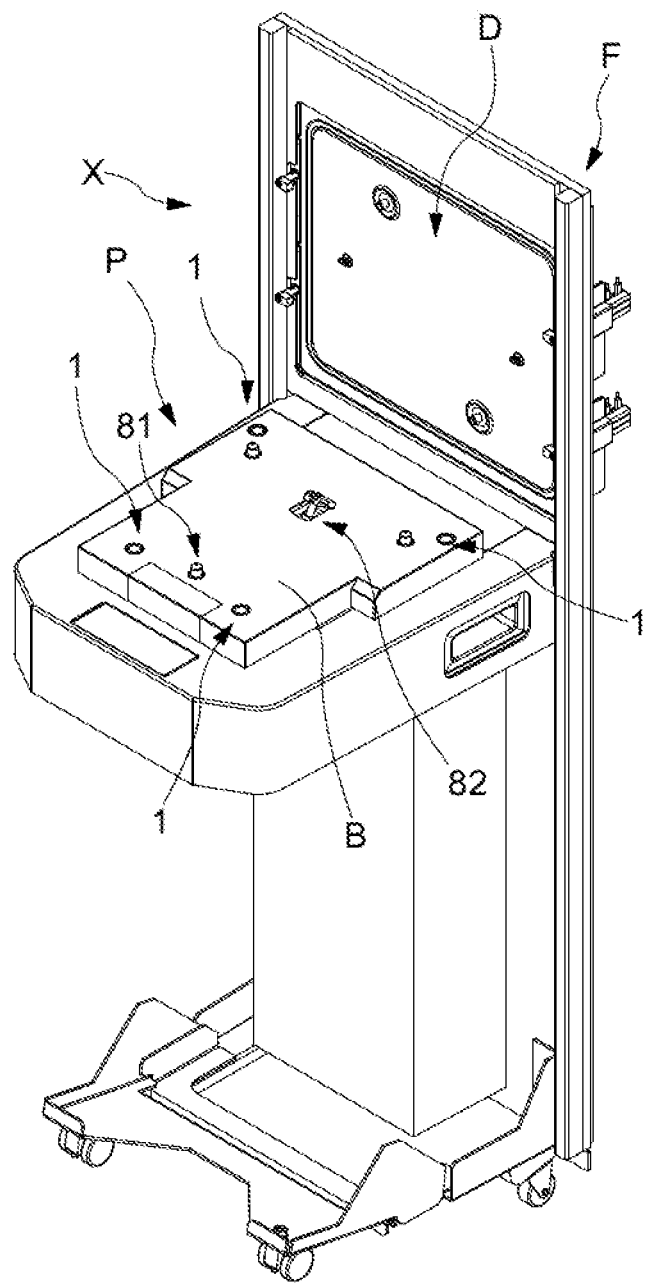
FIG. 1 is an external view according to an embodiment of the present invention.
Figure 2:
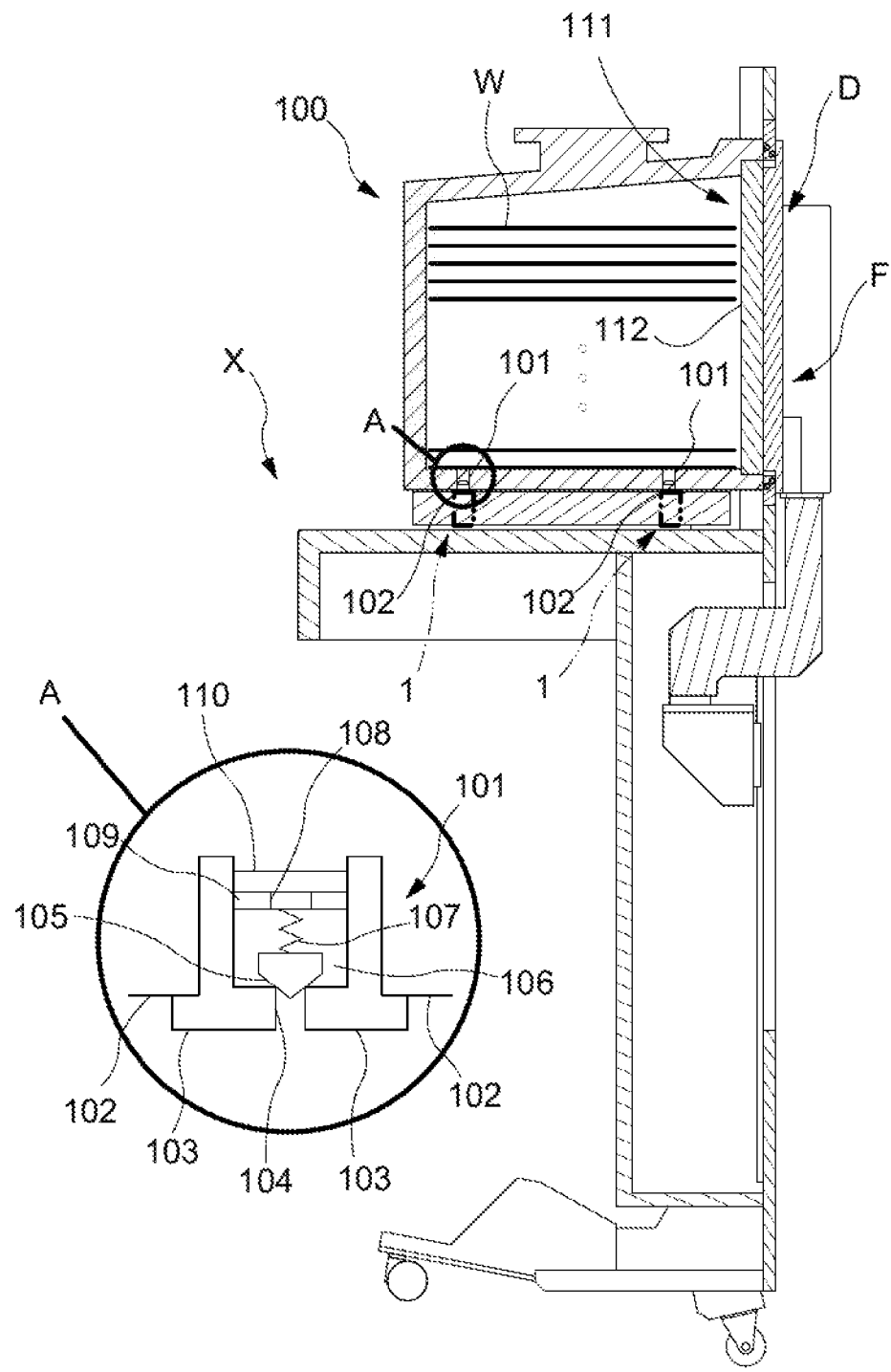
FIG. 2 is a schematic, cross-sectional side view according to the embodiment.
Figure 11:
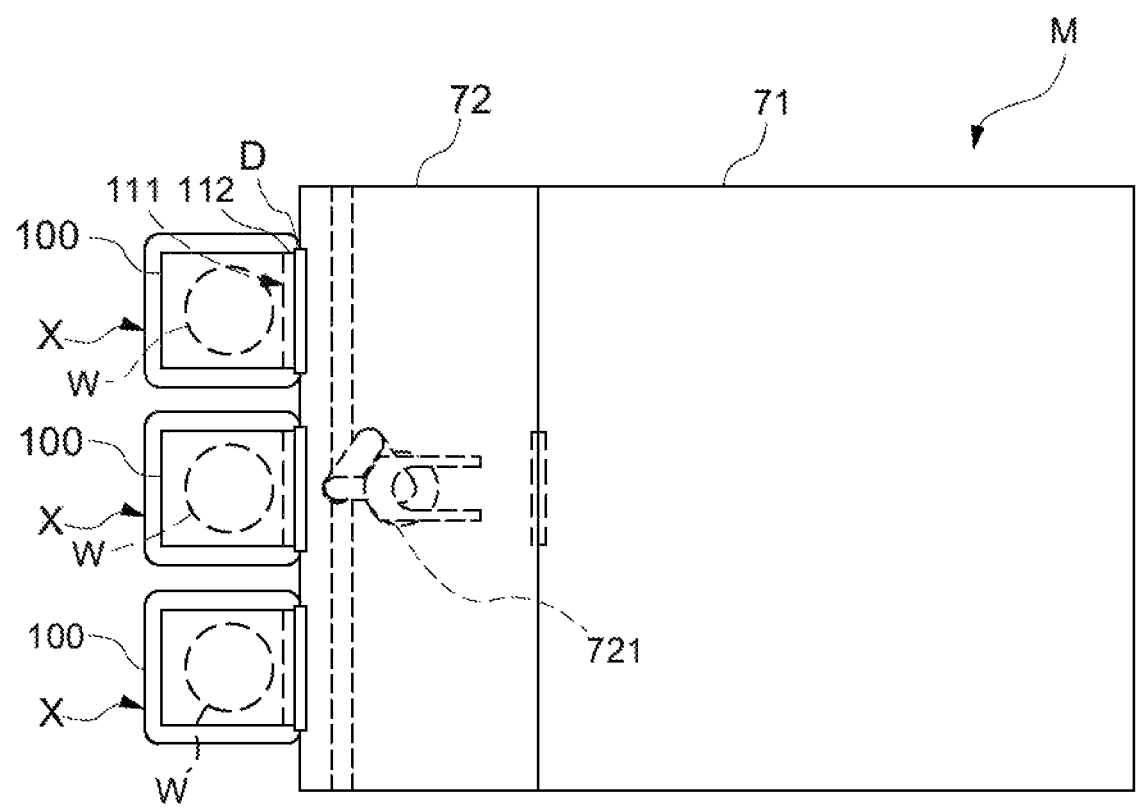
FIG. 11 is a schematic, plan view of a semiconductor manufacturing apparatus according to the embodiment.

A purging nozzle unit 1 that is a gas supply device according to the embodiment can be mounted to a purging device P that is applied to a load port X shown in FIG. 1 and FIG. 2, for example. The load port X is used in a semiconductor manufacturing process, and is equipped in a semiconductor manufacturing apparatus. The semiconductor manufacturing apparatus according to the embodiment is shown in FIG. 11, for example. The semiconductor manufacturing apparatus M is disposed in a clean room. The semiconductor manufacturing apparatus M is provided with: a semiconductor apparatus main body 71; a transfer room 72 disposed so as to be adjacent to the semiconductor apparatus main body 71; at least one load port X (three load ports X in FIG. 11, for example) disposed so as to be adjacent to the transfer room 72. The FOUP 100 is placed on each load port X. This load port X is also configured to bring a door part D into contact with a door 112 of a FOUP 100 shown in FIG. 2, that is provided as an example of a purging target container of the present invention, and open or close off the door part D with the door 112 and then export or import a schematically shown wafer W that is a housing target housed in the FOUP 100 relative to the semiconductor manufacturing apparatus M.

The FOUP 100 that is applied to the embodiment, as shown in FIG. 2, is a known pod configured to house a plurality of wafers W therein and capable of exporting or importing these wafers W via a conveyance inlet 111 formed on a front face, the known pod being provided with a door 112 that is capable of opening or closing off the conveyance inlet 111, and thus, a detailed description thereof is not given here. Incidentally, in the embodiment, the front face of the FOUP 100 denotes a face that is located facing the door part D of the load port X when the FOUP 100 is placed on the load port X. On a bottom face of the FOUP 100, as indicated by the imaginary line in FIG. 5, FIG. 7, and FIG. 9 which will be described later, a purging port 101 is provided in a predetermined location. The port 101 consists essentially of a hollow, cylinder-shaped grommet seal engaged with an aperture part that is formed in the bottom face of the FOUP 100, for example.

The semiconductor manufacturing apparatus M is as to shown in FIG. 11, for example, provided with: at least one load port X; the semiconductor apparatus main body 71 that is disposed at a relatively distant position from the load port X; and the transfer room 72 that is disposed between the semiconductor manufacturing apparatus main body 71 and the load port X, for example. In addition, in the transfer room 72, a transfer mechanism 721 configured to transfer the wafers W in the FOUP 100 placed on each load port X, for example, on a one-by-one wafer basis, between the inside of the FOUP 100 and the inside of the transfer room 72 and between the inside of the transfer room 72 and the inside of the semiconductor manufacturing apparatus main body 71, is provided. Incidentally, it may be also possible to transfer a cassette storing a plurality of wafers W therein all together, between the FOUP 100 and the transfer room 72, and between the transfer room 72 and the semiconductor manufacturing apparatus main body 71. With such a construction, in the clean room, the inside of the semiconductor manufacturing apparatus main body 71, the inside of the transfer room 72, and the inside of the FOUP 100 are maintained at a high degree of cleanliness.

The load port X, as shown in FIG. 1, is provided with: a frame F having the door part D that is disposed in an upright posture, the door part D being capable of opening or closing an aperture part that is capable of communicating with a conveyance inlet 111 of the FOUP 100; a placement base B extending in a substantially horizontal posture in a direction spaced from the semiconductor manufacturing apparatus main body 71; and a purging device P that is capable of charging the purging gas into the FOUP 100 and replacing the gas atmosphere in the FOUP 100 with the purging gas such as nitrogen gas.

The door part D that is provided in the frame F can be actuated between the open position at which while being in intimate contact with a door 112 that is provided on the front face of the FOUP 100 in a state in which the FOUP 100 is placed on the placement base B, the door 112 is opened to thereby open the conveyance inlet 111; and the closed position at which the conveyance inlet 111 is closed off. As a door elevating mechanism (not shown) at least configured to elevate the door part D between the open position and the closed position, a known mechanism can be applied.

The placement base B is disposed in a substantially horizontal posture at a slightly upper position from a center part in a height direction of the frame F, and has a plurality of positioning projections 81 (kinematic pins) that are caused to project upward. In addition, these positioning projections 81 are respectively engaged with positioning depression parts (not shown) that are formed in the bottom face of the FOUP 100 to thereby achieve positioning of the FOUP 100 on the placement base B. Further, on the placement base B, a seating sensor 82, while not shown, which is configured to detect whether or not the FOUP 100 is placed at a predetermined position on the placement base B, is provided. The structure or layout of the positioning projections 81 and the seating sensor 82 can be appropriately set or changed according to the standard specification.

The purging device P is provided with a plurality of purging nozzle units 1 that are disposed in predetermined locations while their upper end parts are exposed on the placement base B.

The plurality of purging nozzle units 1 are mounted at their appropriate positions on the placement base B according to the position of the port 101 that is provided on the bottom face of the FOUP 100. In addition, these nozzle units 1 are capable of coming into contact with the port 101 that is provided at the bottom part of the FOUP 100. Incidentally, in the embodiment, in addition to each of the purging nozzle units 1, a discharge valve configured to discharge the gas contained in the FOUP 100 when the pressure in the FOUP 100 increases is appropriately disposed in any location that corresponds to the port 101. A construction of the discharge valve is made in conformity with the existing construction and thus a specific description thereof is not given here.

Also, a construction of the port 101 that is provided in the FOUP 100 will be specifically described here. The port 101 is arranged so as to correspond to the purging nozzle unit 1 as described above. In addition, as shown in an enlarged manner at portion A in FIG. 2 for example, this port 101 is provided with: a base 103; a gas flow inlet 104 that is provided in the base 103, into which a predetermined gas is to be flown; a check valve 105; a valve chamber 106 configured to house the check valve 105 so as to be movable; a compression spring 107 configured to bias the check valve 105 toward the gas flow inlet 104; a communication port 108; a support plate 109 configured to support the compression spring 107; and a filter 110 or the like. Since the port 101 of such a structure is an existing one, a detailed description thereof is not given here. A conventional general mode of introducing a purge gas into the FOUP 100 via such an existing port 101 is as follows. That is, the purge gas that is the predetermined gas is caused to flow into the gas flow inlet 104, and the compression spring 107 is compressed by the pressure according to a flow rate of the purge gas to generate a gap between the check valve 105 and the base 103. As a result, the purge gas passes through the filter 110 from the gap through the valve chamber 106 and the communication port 108, and is introduced into the FOUP 100.

In addition, the opening/closing mechanism according to the present invention is configured with the gas flow inlet 104, the check valve 105, and the compression spring 107 that configure the port 101.

Each purging nozzle unit 1, as shown in FIG. 3 to FIG. 9, is provided with: a nozzle 2 that is a nozzle structure division; a housing 3 that is a housing structure division configured to hold the nozzle 2 in such a manner as to enable elevating movement; and a gas introducing part 4 configured to export or import compression air so as to operate the nozzle 2 relative to the housing 3. Incidentally, it is to be noted that in the present specification, the gas introducing part 4 is merely schematically shown.

Here, the purging nozzle unit 1 that is a gas supply device according to the embodiment is characterized by including: the housing 3 that is capable of passing the predetermined gas so as to supply the gas through the inside of the FOUP 100; a nozzle 2 having: a first nozzle 21 that is a nozzle section comes into contact with the proximity of the port 101 that is a port section provided with one face of the FOUP 100, the port section including the opening/closing mechanism therein; and a second nozzle 22 that is a pressing part configured to open or close off the opening/closing mechanism; and a operation adjustment space 5 provided, for example, all over the housing 3 and the nozzle 2, the operation adjustment space 5 being adapted to increase or decrease so as to operate the nozzle 2 between the use posture in which the predetermined gas can be supplied into the target container via the port 101 and the standby posture in which the predetermined gas cannot be supplied into the target container via the port 101. In addition, the purging nozzle unit 1 according to the embodiment further has the gas introducing part 4 configured to export or import the compression air that is control air relative to the operation adjustment space 5 to thereby control the operation of the nozzle 2.

Hereinafter, constituent elements of the purging nozzle unit 1 that is a gas supply device will be described.

The housing 3 is capable of passing the predetermined gas so as to replace, with the predetermined gas, the internal atmosphere of the FOUP 100 that is the target container. This housing 3 has: a housing main body 31 formed in the shape of a schematically rectangular parallelepiped; an outer ring 32 provided on an interior wall 35 of the housing main body 31, the outer ring 32 being formed in a pair with which an outer circumferential face 2a of the nozzle 2 comes into contact; and an introducing inlet 33 that communicates with an area from an exterior wall 34 of the housing main body 31 toward the nozzle 2, for introducing compression air toward the nozzle 2. Specifically, the introducing inlet 33 passes from the exterior wall 34 toward the interior wall 35 of the housing main body 31, and communicates with the operation adjustment space 5 that is formed between the housing 3 and the nozzle 2.

The nozzle 2 has: a first nozzle 21 configured to come into intimate contact with an outer edge 102 of the port 101 that is provided on one face of the target container to thereby prevent leakage of the air contained in the FOUP 100 to the outside; and a second nozzle 22 having: a pressing face configured to press the port 101; and an injecting part configured to inject a predetermined air into the target container. The first nozzle 21 has: a contact face 23 that is capable of coming into intimate contact with the outer edge 102 of the port 101; and an inner ring 24 that is a packing for supporting the second nozzle 22 in a gapless manner. The second nozzle 22 has: a gas introducing inlet 25 for introducing the predetermined gas; a gas guiding path 26 configured to pass, at an axial portion 21a, the predetermined gas that is introduced from the gas introducing inlet 25, in other words, nitrogen gas, so as to be guided upward; a pressing face 27 configured to abut, at a tip end, against the port 101 that is the target container, the pressing face being pressed to be thereby able to open the check valve 105 (FIG. 2) inside of the port 101; and a gas injecting port 28 formed in the shape of a slit from the pressing face 27 to a proximal side, for introducing nitrogen gas into the FOUP 100. In addition, in the embodiment, a second flow path 25a configured to guide purging gas that is the predetermined gas in a horizontal direction from the gas introducing inlet 25; and a first flow path 26a that is continuous to the second flow path 25a, and that is configured to guide the purging gas in a vertical direction, are integrally constructed in a state in which their relative positions are fixed. However, it is to be noted that the present invention does not preclude an aspect in which the relative positions of the first and second flow paths 26a, 25a are interchangeably constructed.

The operation adjustment space 5 has: a first operation adjustment space 51 provided between the housing 3 and the first nozzle 21, the first operation adjustment space 51 being adapted to increase or decrease so as to operate the first nozzle 21 between an intimate contact posture (P1) in which the first nozzle 21 is brought into intimate contact with the outer edge 102 of the port 101 and a spaced posture (P2) in which the first nozzle 21 and the port 101 are spaced from each other from the intimate contact posture (P1); a second operation adjustment space 52 provided between the first nozzle 21 and the second nozzle 22, the second operation adjustment space 52 being adapted to increase or decrease so as to operate the second nozzle 22 between the closed posture (Q2) in which the second nozzle 22 is spaced from the port 101 (specifically, the check valve 105) to thereby close off the port 101 and the open posture (Q1) in which the port 101 (specifically, the check valve 105) is pressed to thereby open the port 101; and a communication path 53 configured to cause the first operation adjustment space 51 and the second operation adjustment space to communicate with each other.

The first operation adjustment space 51 is capable of changing the posture from the spaced posture (P2) in which the contact face 23 of the first nozzle 21 is spaced from the outer edge 102 of the port 101 when the gas targeted to be introduced, in other words, compression air is introduced from the introducing inlet 33 of the housing 3 to the intimate contact posture (P1) in which the contact face comes into intimate contact with the outer edge 102 of the port 101.

In the second operation adjustment space 52, the compression air is introduced through the communication path 53 after the compression air is introduced into the first operation adjustment space 51 and the first nozzle 21 is set in the intimate contact posture (P1). Thus the posture of the second nozzle 22 is changed to the open posture (Q1) in which the port 101 (specifically, the check valve 105) is pressed to thereby open the port 101 from the closed posture (Q2) in which second nozzle 22 is spaced from the port 101 (specifically, the check valve 105) to thereby close off the port 101.

The communication path 53 is configured to supply control gas to the first operation adjustment space 51 and then introduce another kind of gas, in other words, the compression gas into the first and second operation adjustment spaces 51, 52 to thereby set the first nozzle 21 in the intimate contact posture (P1) and then operate the second nozzle 22 toward the open posture (Q1); and to suction the compression air that is the control gas in the first and second operation adjustment spaces 51, 52 to thereby set the second nozzle 22 in the closed posture (Q2) and then set the first nozzle 21 in the spaced posture (P2). While the communication path 53 is indicated by the dashed line in each of FIG. 4, FIG. 5, FIG. 7, and FIG. 9, one or a plurality of communication paths are provided in the peripheral direction of the first and second nozzles 22. In addition, the communication path 53 is set so that by adjusting the diameter and position and number of these nozzles, when compression air is introduced, the first operation adjustment space 51 changes the posture of the first nozzle 21 to the intimate contact posture (P1) and then the compression air is introduced into the second operation adjustment space 52 so as to be able to change the posture of the second nozzle 22 in the open posture (Q1).

The gas introducing part 4 is for exporting or importing compression air as an example of another kind of gas that is different from nitrogen gas relative to the first operation adjustment space 51 and the second operation adjustment space 52 to thereby control the operation of the first nozzle 21 and the second nozzle 22. The gas introducing part 4 is configured to export or import the control air relative to the first operation adjustment space 51 and interposing the communication path 53 configured to cause the first operation adjustment space 51 and the second operation adjustment space 52 to communicate with each other to be thereby able to increase or decrease the second operation adjustment space 52.

Figure 3:
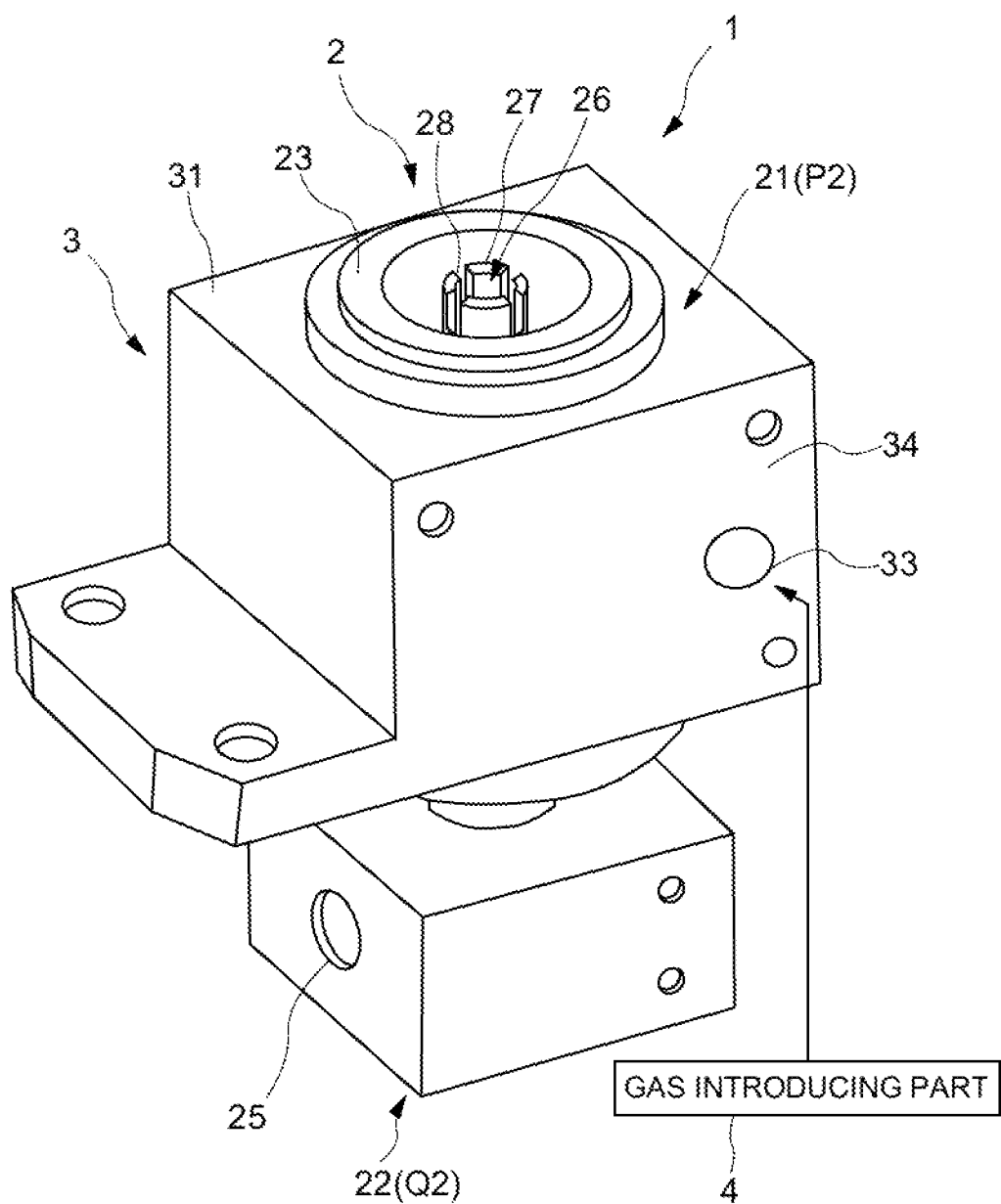
FIG. 3 is an external view of essential portions according to the embodiment.
Figure 4:
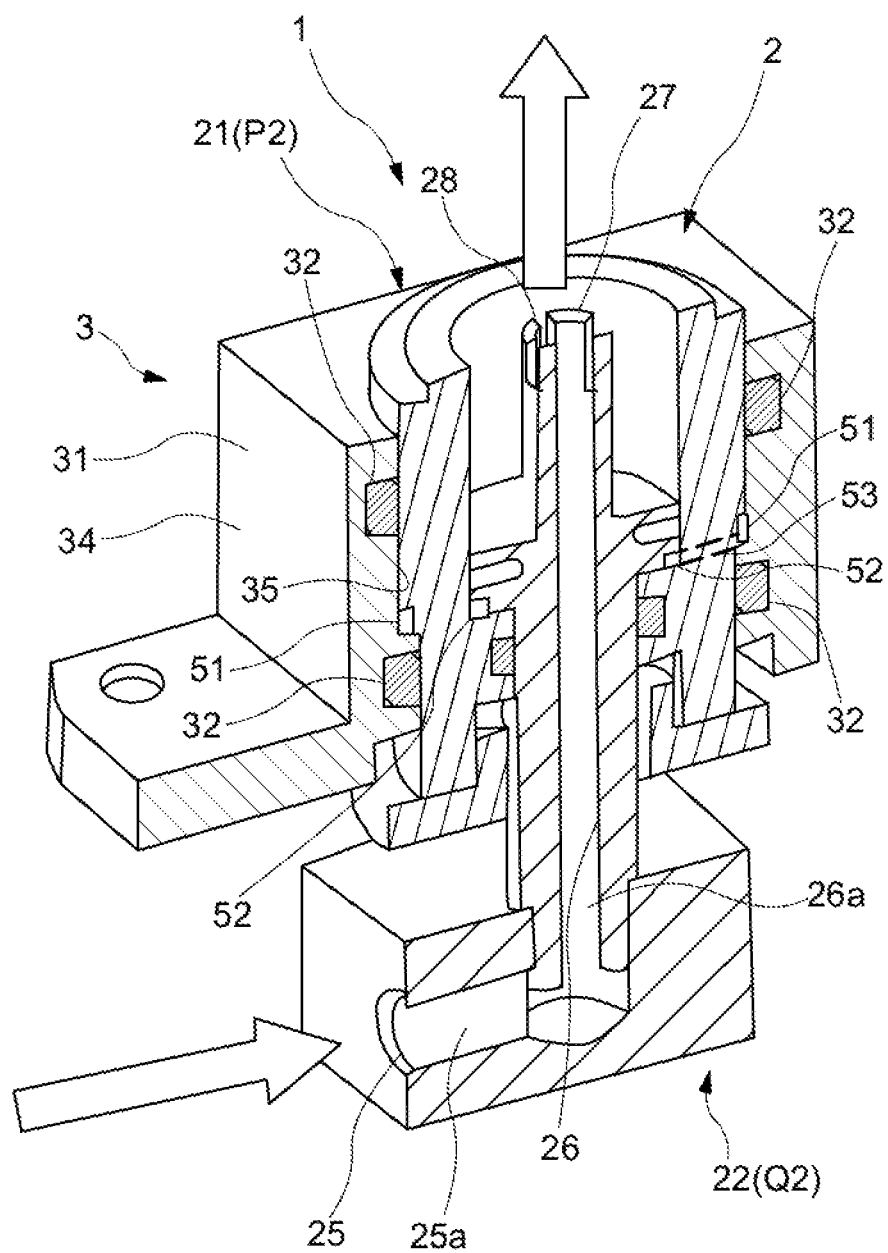
FIG. 4 is a schematic, cross-sectional view according to FIG. 3.
Figure 5:
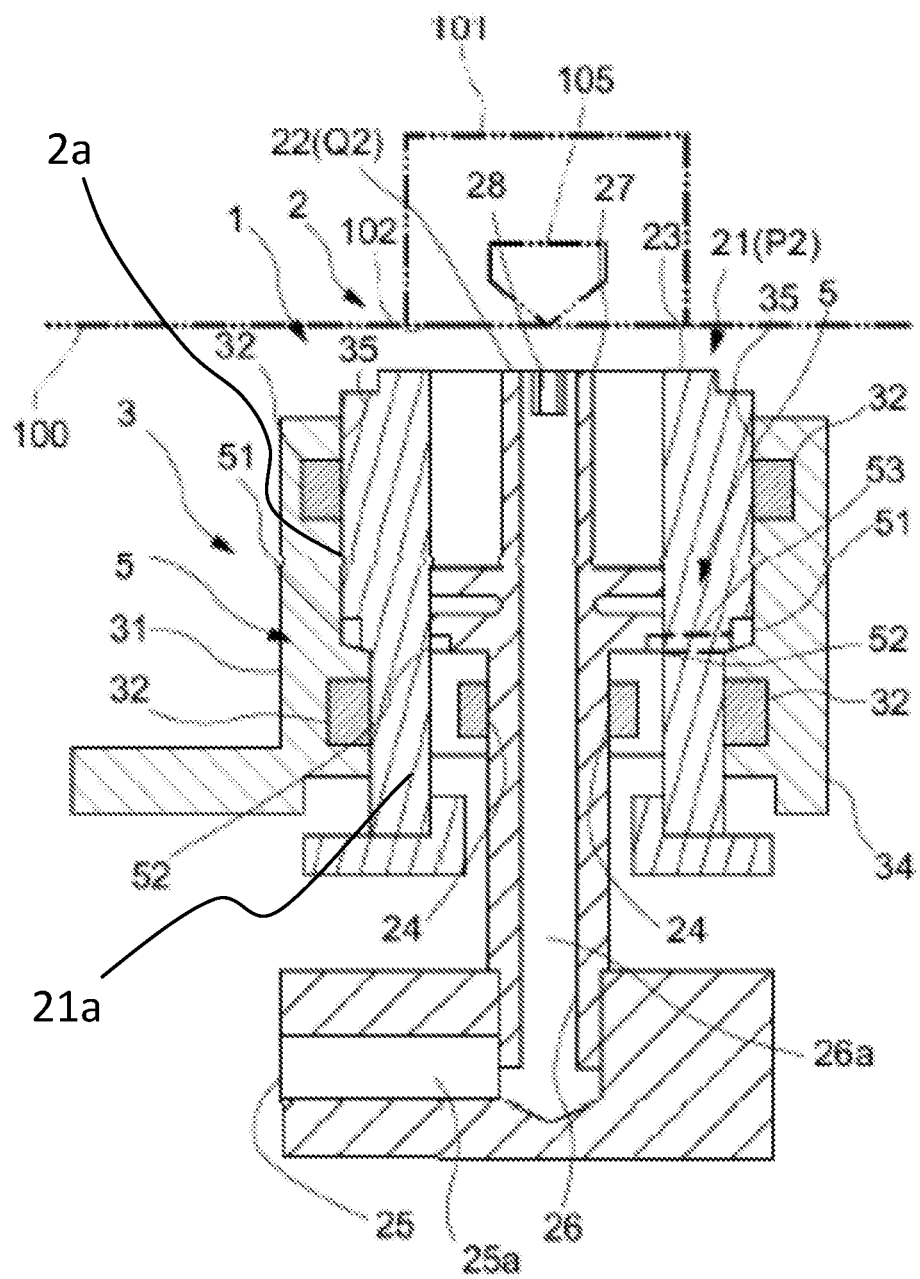
FIG. 5 is a central, cross-sectional side view according to FIG. 3.
Figure 6:
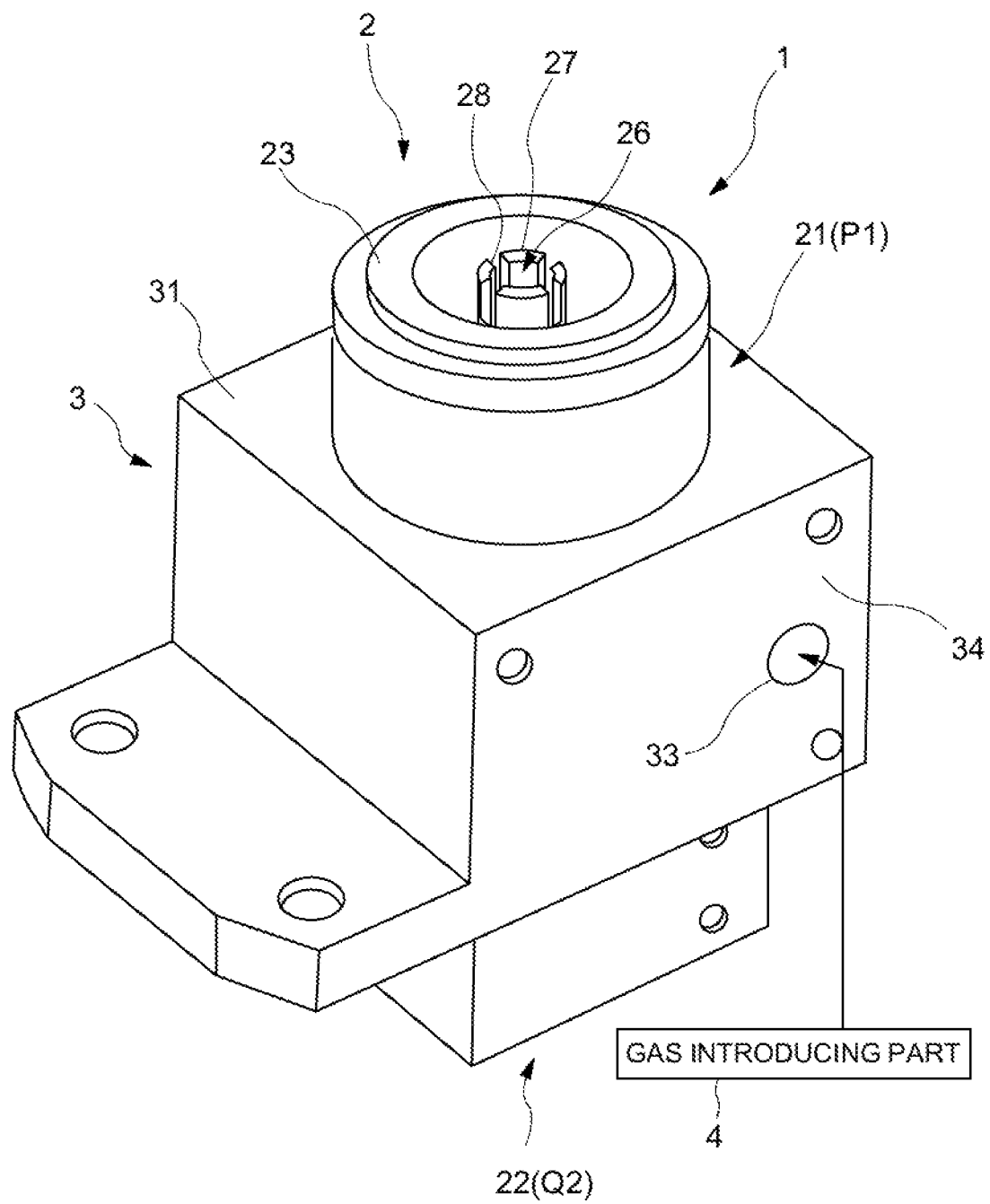
FIG. 6 is an illustrative view of an operation according to FIG. 3.
Figure 7:
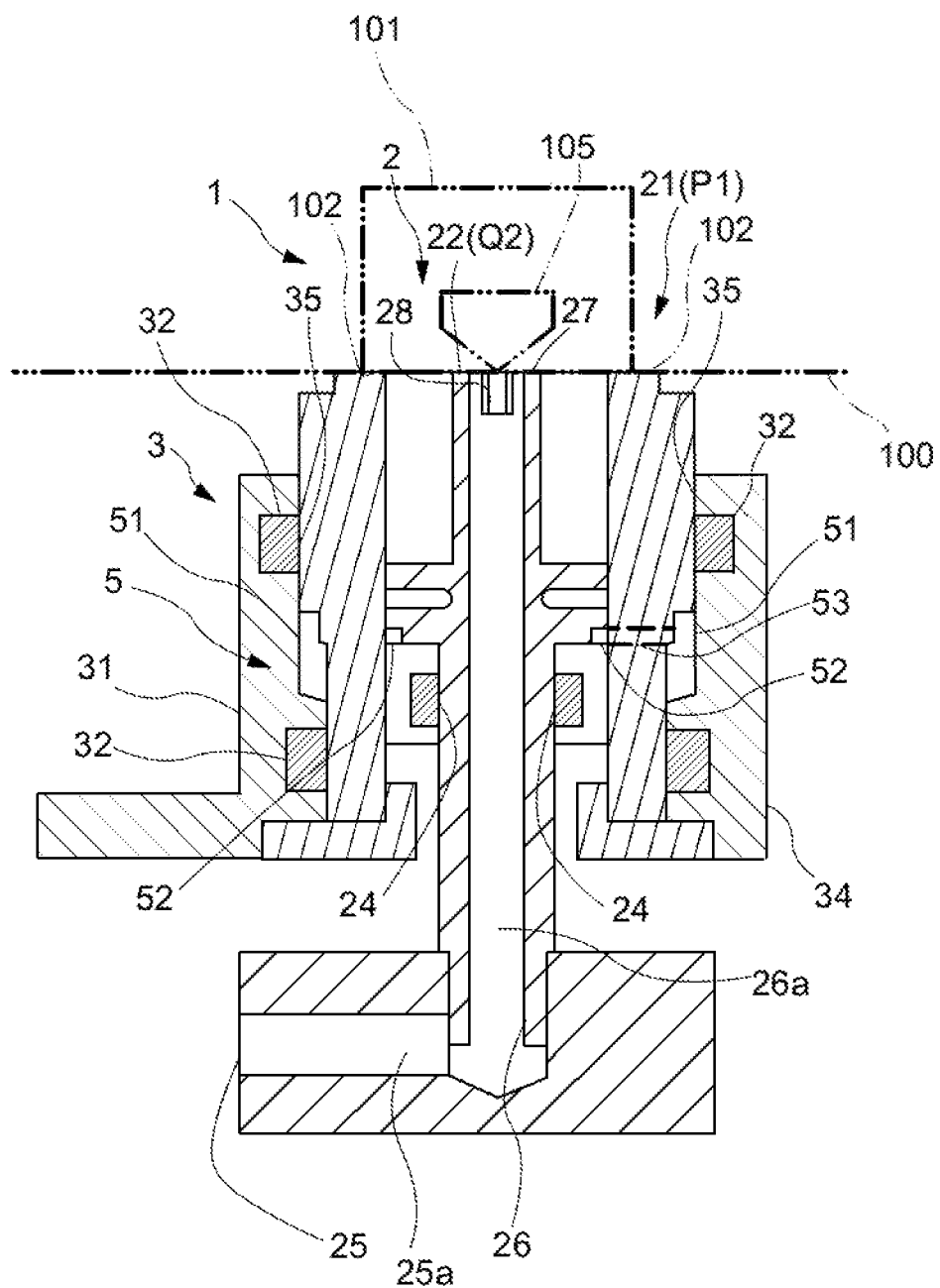
FIG. 7 is an illustrative view of an operation according to FIG. 5.
Figure 8:
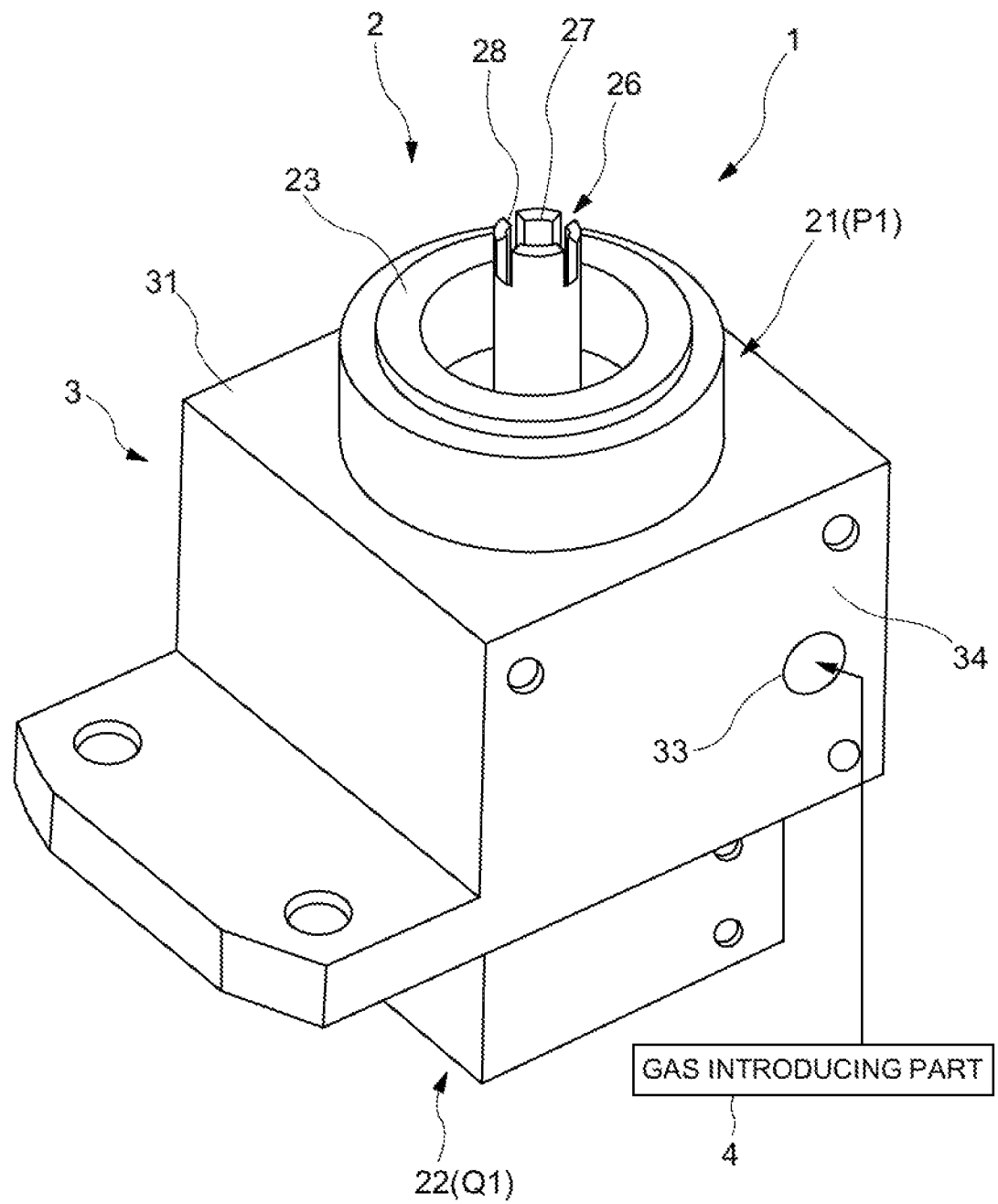
FIG. 8 is an illustrative view of an operation according to FIG. 3.
Figure 9:
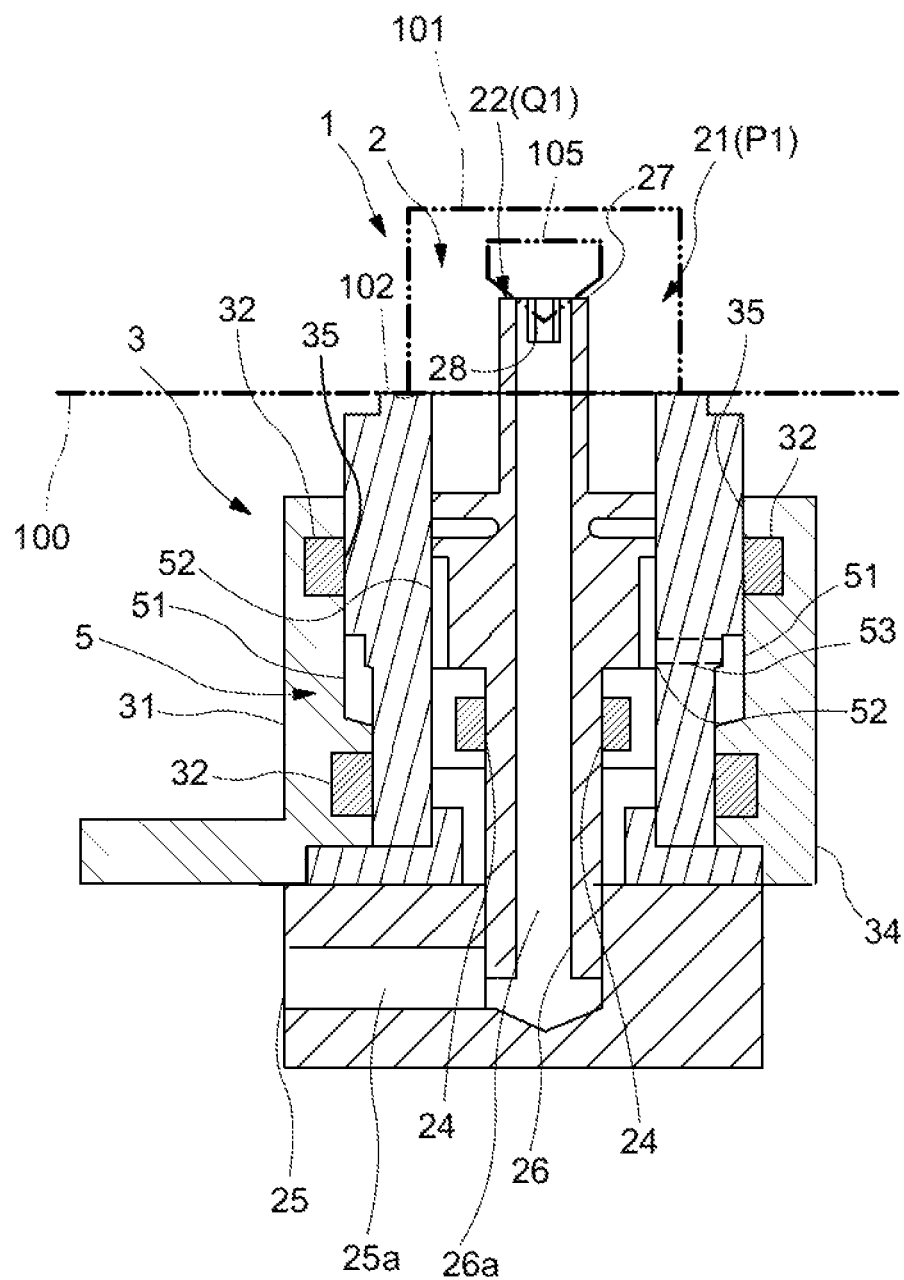
FIG. 9 is an illustrative view of an operation according to FIG. 5

In the embodiment, the compression air is introduced into the operation adjustment space 5, and a current posture can be thereby controlled in a stepwise manner from the standby state shown in FIG. 3 to FIG. 5, in other words, the state in which the first nozzle 21 is set in the spaced posture (P2) and the second nozzle 22 is set in the closed posture (Q2); to the middle posture, in other words, the state in which, as shown in FIG. 6 and FIG. 7, the first nozzle 21 is set in the intimate contact posture (P1) and the second nozzle 22 is set in the closed posture (Q2) while the first nozzle 21 being in intimate contact with the outer edge 102 of the port 101, and the second nozzle 22 does not open the port 101 while being in intimate contact with the outer edge 102 of the port 101, and further, as is the case with the use position shown in FIG. 8 and FIG. 9, the second nozzle 22 is set in the open posture (Q1), in other words, the second nozzle 22 projects further upward and the pressing face 27 pushes up the port 101 (specifically, the check valve 105) to thereby open the port 101.

Further, of course, when the compression air is suctioned by controlling the gas introducing part 4 from the state (P1, Q1) shown in FIG. 8 and FIG. 9, a current state is returned to the state (P2, Q2) shown in FIG. 3 to FIG. 5 via the state (P1, Q2) shown in FIG. 6 and FIG. 7. In other words, according to the embodiment, the compression air different from nitrogen gas that is the predetermined gas is exported or imported relative to the gas introducing part 4 to thereby be able to smoothly and appropriately carry out an elevating movement of a respective one of the first nozzle 21 and the second nozzle 22 that configure the nozzle 2.

The purging nozzle unit 1 according to the embodiment, as described in detail hereinabove, is mounted in a plurality of predetermined locations in the placement base B of the load port X in a unified state (the proximity of four corners of the placement base B in the embodiment) to thereby function as a purging device P that is capable of replacing, with purge gas, the gas atmosphere in the FOUP 100 that is placed on the placement base B.

Figure 10:
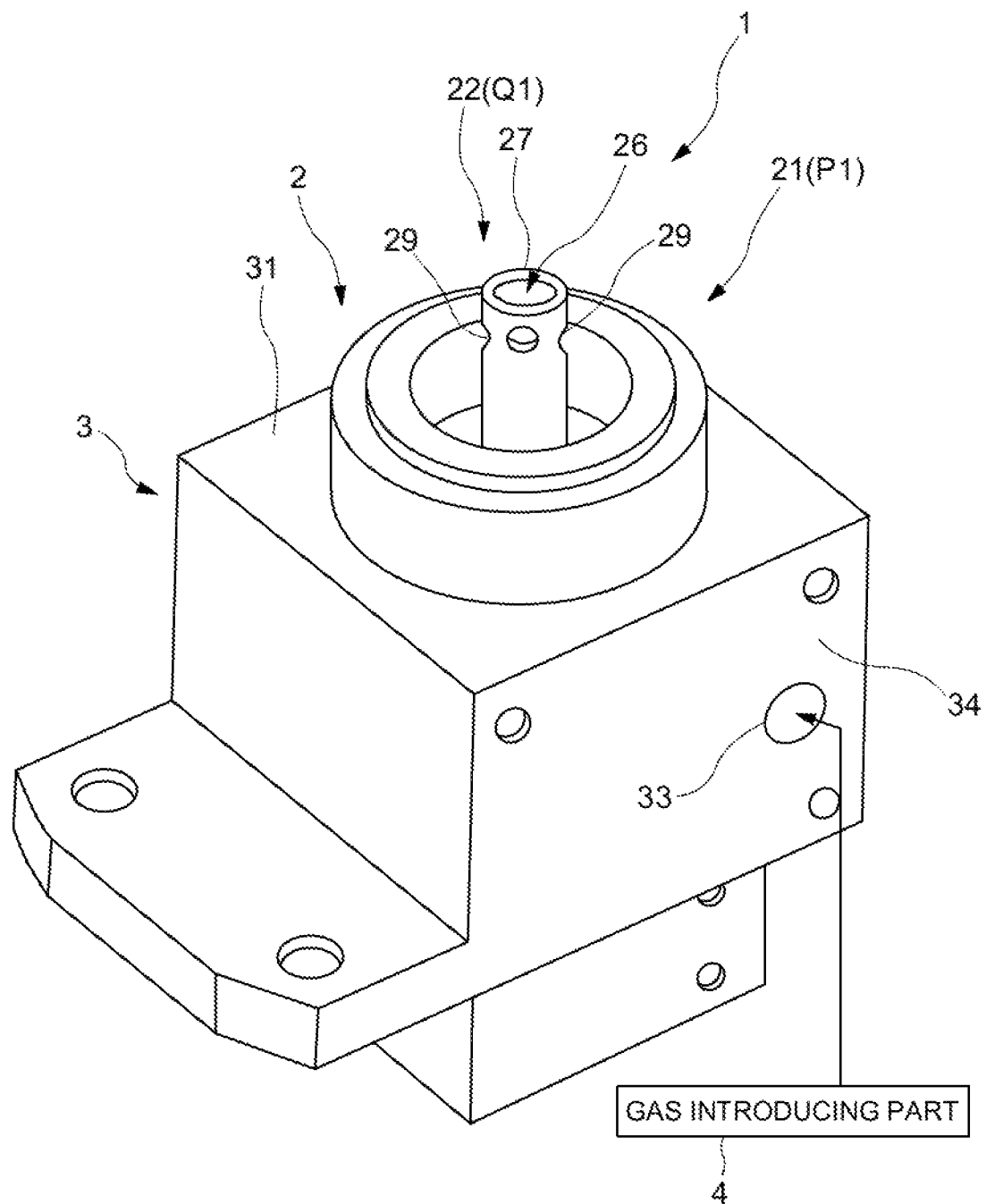
FIG. 10 is an external view that corresponds to FIG. 8 according to a modification example of the embodiment.

In addition, as a modification example of the embodiment, a purging nozzle unit 1 that is a gas supply device shown in FIG. 10 can be exemplified. With respect to the modification example, like constituent elements corresponding to those of the embodiment are designated by like reference numerals and thus a detailed description thereof is not given here.

Specifically, the purging nozzle unit 1 according to the modification example is different from that according to the embodiment in terms of the shape of the second nozzle 22. In the second nozzle 22, an aperture 29 is provided in a position spaced from the pressing face 27, causing the aperture 29 to correspond to the gas injecting port 28. With such a construction as well, the advantageous effect similar to that of the embodiment is attained.

As described above, the gas supply device according to the embodiment is characterized by including: the housing 3 that is capable of passing a predetermined gas so as to replace the internal atmosphere of the target container with the predetermined gas; the nozzle 2 configured to come into intimate contact with the proximity of the port 101 that is provided on one face of the target container and then press the port 101 so as to be opened; the operation adjustment space 5 being adapted to increase or decrease so as to operate the nozzle 2 between the use posture in which the predetermined gas can be supplied into the target container via the port 101 and the standby posture in which the predetermined gas cannot be supplied into the target container via the port 101; and the gas introducing part 4 configured to export or import the gas relative to the operation adjustment space 5 to thereby control the operation of the nozzle 2.

In this manner, the predetermined gas can be preferably introduced into the FOUP 100 that is the target container so that the nozzle 2 is operated regardless of whatsoever the pressure of the predetermined gas to be supplied into the target container may be. Also, the nozzle 2 is configured to not only to open the port 101 but also to come into intimate contact with the proximity of the port 101 to thereby efficiently avoid the leakage of the predetermined gas to the outside, so that the predetermined gas can be efficiently introduced into the target container. As a result, according to the present embodiment, there can be provided a purging nozzle unit 1 that is capable of supplying the internal atmosphere of a target container with a predetermined gas at a higher efficiency; and a purging device P provided with the purging nozzle unit 1; and a load port X provided with the purging device P; and the semiconductor manufacturing apparatus M provided with the load port X.

As a specific construction that is capable of replacing the internal atmosphere of the target container with the predetermined gas at a high efficiency, in the embodiment, there is employed a construction in which the nozzle 2 has: the first nozzle section 21 that is a nozzle section configured to come into intimate contact with the outer edge 102 of the port 101 that is provided on one face of the target container to thereby prevent the leakage of the gas contained in the target container to the outside; and the second nozzle 22 that is a pressing part having the pressing face 27 configured to press the port 101 and the injecting part configured to inject the gas into the target container.

Also, as an example of the construction of the operation adjustment space 5 for more efficiently replacing the gas contained in the target container with the predetermined gas, in the embodiment, a construction is applied in such a manner that the operation adjustment space 5 has: the first operation adjustment space 51 provided between the housing 3 and the first nozzle 21, the first operation adjustment space 51 being adapted to increase or decrease so as to operate the first nozzle 21 between the intimate contact posture (P1) in which the first nozzle 21 is brought into intimate contact with the outer edge 102 of the port 101 and the spaced posture (P2) in which the first nozzle 21 and the port 101 are spaced from each other from the intimate contact posture (P1); and the second operation adjustment space 52 provided between the first nozzle 21 and the second nozzle 22, the second operation adjustment space 52 being adapted to increase or decrease so as to operate the second nozzle 22 between the closed position (Q2) at which the second nozzle 22 is spaced from the port 101 to thereby close off the port 101 and the open posture (Q1) at which the second nozzle 22 presses the port 101 to thereby open the port 101.

In addition, as a specific construction for more efficiently replacing the gas contained in the FOUP 100 with the predetermined gas, a method for controlling the purging nozzle unit 1, according to the embodiment, is directed to the controlling method that is applied to the purging nozzle unit 1 having: the first operation adjustment space 51 provided between the housing 3 and the first nozzle 21, the first operation adjustment space 51 being adapted to increase or decrease so as to operate the first nozzle 21 between the intimate contact posture (P1) in which the first nozzle 21 is brought into contact with the outer edge 102 of the port 101 and the spaced posture (P2) in which the first nozzle 21 and the port 101 are spaced from each other from the intimate contact posture (P1); and the second operation adjustment space 52 provided between the first nozzle 21 and the second nozzle 22, the second operation adjustment space 52 being adapted to increase or decrease so as to operate the second nozzle 22 between the closed posture (Q2) in which the second nozzle 22 is spaced from the port 101 to thereby close off the port 101 and the open posture (Q1) in which the second nozzle 22 presses the port 101 to thereby open the port 101, and is characterized in that by way of the gas introducing part 4, compression air is exported or imported relative to the first operation adjustment space 51 and the second operation adjustment space 52.

Further, in order to control the operation of the first nozzle 21 and the second nozzle 22 with a simpler construction, in the embodiment the control gas introducing device is configured to export or import the control gas relative to the first operation adjustment space 51, and the communication path 53 configured to cause the first operation adjustment space 51 and the second operation adjustment space 52 to communicate with each other is further provided so as to be thereby able to increase or decrease the second operation adjustment space 52 as well.

Furthermore, in order to more efficiently control the operation of the first nozzle 21 and the second nozzle 22, in the embodiment the communication path 53 is configured to operate the first nozzle 21 toward the intimate contact posture (P1) in which the first nozzle 21 comes into intimate contact with the outer edge 102 of the port 101 and then operate the second nozzle 22 toward the open posture (Q1).

Still furthermore, the semiconductor manufacturing apparatus M according to the embodiment is provided with the load port X, and is characterized by receiving the FOUP 100 that is the purging target container and then exporting or importing the wafers that are stored in the FOUP 100, via the conveyance inlet 111 formed on the front face of the FOUP 100 relative to the inside of the FOUP 100.

While the embodiment of the present invention has been described hereinabove, the present invention is not limitative to the constructions of the embodiment. While in the foregoing embodiment, there has been disclosed the gas introducing part 4 that is constructed in such a manner as to export or import compression air as an example of another kind of gas that is different from nitrogen gas relative to the first operation adjustment space 51 and the second operation adjustment space 52, of course, it is needless to say that nitrogen gas or any other inert gas or air dried may be used as control gas without being limitative to the compression air.

While in the foregoing embodiment, there has been formed a rising operation adjustment space in which compression air is introduced into the first operation adjustment space and the nozzle mechanism is thereby risen, there may be further provided a lowering operation adjustment space in which the nozzle mechanism is lowered by introduction of compression air in place of suctioning the compression air. With respect to the second operation adjustment space as well, not only a rising operation adjustment space but also a lowering operation adjustment space may be provided similarly. Alternatively, only either one of the rising and lowering operation adjustment spaces may be provided in combination with an elastic biasing member such as a spring.

In addition, while in the foregoing embodiment, there has been employed a construction in which the port 101 that is a valve is opened by the second nozzle 22 that is a pressing part configuring the first flow path 26a, a pressing part for opening the port 101 may be provided in addition to the member forming the first flow path 26a. Further, while in the foregoing embodiment, a construction in which the member forming the second flow path 25a relatively moves to the housing 3 has been applied, there may be employed a construction in which the second flow path is fixed to the housing so as to operate relative to the first flow path.

Furthermore, while in the foregoing embodiment, there has been exemplified an aspect in which the operation adjustment spaces 51,52 and the ventilation holes are formed based on a one-to-one relationship, for example, there may be employed a construction in which a plurality of ventilation holes communicating with one operation adjustment are formed. Still furthermore, while in the foregoing embodiment, there has been disclosed an aspect in which a nozzle 2 is controlled merely by control of the compression air by way of the gas introducing part 4, it is to be noted that this aspect does not preclude any aspect in which a nozzle is elastically biased so as to be thereby operable.

A variety of modifications can also occur to other constructions without departing from the spirit of the present invention.

What is claimed is:
1. A gas supply device for supplying a predetermined gas into a target container comprising a port section, the gas supply device comprising:
    a housing structure division comprising a housing main body having an outer wall and an inner wall, the outer wall provided with an introducing inlet for introducing another gas;

a nozzle structure division to supply the predetermined gas into the target container, the nozzle structure division comprising:
an axial portion having an outer circumferential face which is slidably engaged with the inner wall of the housing main body;
a nozzle section provided on the axial portion, the nozzle section configured to come into contact with the port section that is provided on one face of the target container, the port section including an opening/closing mechanism therein; and
a pressing part provided on the axial portion to press the port section to open the opening/closing mechanism; and
an operation adjustment space provided between the inner wall of the housing main body and the axial portion of nozzle structure division and the operation adjustment space is closed to the port section, the operation adjustment space communicating with the introducing inlet and being adapted to increase or decrease a volume of the operation adjustment space when injecting said another gas therein through the introducing inlet so as to operate the nozzle structure division between a use posture in which the predetermined gas can be supplied into the target container via the port section and a standby posture in which the predetermined gas cannot be supplied into the target container via the port section.

2. The gas supply device according to claim 1, wherein the nozzle section comes into intimate contact with an outer edge of the port section that is provided on said one face of the target container to thereby prevent leakage of the gas contained in the target container to an outside, and
the pressing part has: a pressing face configured to press the opening/closing mechanism and an injecting part configured to inject the predetermined gas into the target container.

3. The gas supply device according to claim 2, wherein the operation adjustment space has:
a first operation adjustment space provided between the housing structure division and the nozzle section, the first operation adjustment space being adapted to increase or decrease the volume of the first operation adjustment space so as to operate the nozzle section between an intimate contact posture in which the nozzle section is brought into contact with the outer edge of the port section and a spaced posture in which the nozzle section and the port section are spaced from each other from the intimate contact posture; and
a second operation adjustment space provided between the nozzle section and the pressing part, the second operation adjustment space being adapted to increase or decrease the volume of the second operation adjustment space so as to operate the pressing part between a closed posture in which the pressing part is spaced from the port section to thereby close off the port section and an open posture in which the pressing part presses the port section to thereby open the port section.

4. A load port comprising the gas supply device according to claim 3 in plurality, wherein a gas atmosphere in the target container is capable of being replaced with nitrogen or dry air while the pressing part of the gas supply device is caused to communicate with each of the plurality of the port sections that are provided on a bottom face of the target container.

5. A semiconductor manufacturing apparatus comprising:
the load port according to claim 4;
a semiconductor manufacturing apparatus main body; and
a transfer room that is disposed between the semiconductor manufacturing apparatus main body and the load port;
and
the semiconductor manufacturing apparatus is configured to receive the target container and export or import a wafer that is stored in the target container via a conveyance inlet formed on a front face of the target container.

6. The gas supply device according to claim 3, wherein said another gas is directly exported or imported relative to the first operation adjustment space, and
a communication path configured to cause the first operation adjustment space and the second operation adjustment space to communicate with each other is further provided so as to be thereby able to increase or decrease the second operation adjustment space as well.

7. The gas supply device according to claim 6, wherein the communication path is configured to operate the nozzle section toward the intimate contact posture in which the nozzle section comes into contact with the outer edge of the port section and then operate the pressing part toward the open posture.

8. A load port comprising the gas supply device according to claim 6 wherein the communication path is configured to operate the nozzle section toward the intimate contact posture in which the nozzle section comes into contact with the outer edge of the port section and then operate the pressing part toward the open posture.

9. A load port comprising the gas supply device according to claim 3, wherein
said another gas is directly exported or imported relative to the first operation adjustment space, and
a communication path configured to cause the first operation adjustment space and the second operation adjustment space to communicate with each other is further provided so as to be thereby able to increase or decrease the second operation adjustment space as well.

10. A load port comprising the gas supply device according to claim 2 in plurality, wherein a gas atmosphere in the target container is capable of being replaced with nitrogen or dry air while the pressing part of the gas supply device is caused to communicate with each of the plurality of the port sections that are provided on a bottom face of the target container.

11. A semiconductor manufacturing apparatus comprising:
the load port according to claim 10;
a semiconductor manufacturing apparatus main body; and
a transfer room that is disposed between the semiconductor manufacturing apparatus main body and the load port;
and
the semiconductor manufacturing apparatus is configured to receive the target container and export or import a wafer that is stored in the target container via a conveyance inlet formed on a front face of the target container.

12. The gas supply device according to claim 2, wherein the pressing part configured to move relative to the nozzle section.

13. A load port comprising the gas supply device according to claim 2, wherein
the pressing part configured to move relative to the nozzle section.

14. A method for controlling a gas supply device according to claim 1, the method comprising:
a housing structure division that is capable of passing a predetermined gas so as to replace an internal atmosphere of a target container with the predetermined gas;
a nozzle section configured to come into intimate contact with an outer edge of a port section that is provided on one face of the target container to thereby prevent leakage of the gas contained in the target container to an outside;
a pressing part having a pressing face configured to press the port section and an injecting part configured to inject the predetermined gas into the target container;
a first operation adjustment space provided between the housing structure division and the nozzle section, the first operation adjustment space being adapted to increase or decrease so as to operate the nozzle section between an intimate contact posture in which the nozzle section is brought into intimate contact with an outer edge of the port section and a spaced posture in which the nozzle section and the port section are spaced from each other from the intimate contact posture; and
a second operation adjustment space provided between the nozzle section and the pressing part, the second operation adjustment space being adapted to increase or decrease so as to operate the pressing part between a closed posture in which the pressing part is spaced from the port section to thereby close off the port section and an open posture in which the pressing part presses the port section to thereby open the port section, wherein
the method including exporting or importing control gas to thereby control an operation of the nozzle section and the pressing part.

15. The method for controlling the gas supply device, according to claim 14, wherein the control gas is directly exported or imported relative to the first operation adjustment space, and a communication path configured to cause the first operation adjustment space and the second operation adjustment space to communicate with each other is further provided so as to be thereby able to increase or decrease the second operation adjustment space as well.

16. The method for controlling the gas supply device, according to claim 15, wherein the communication path is configured to operate the nozzle section toward the intimate contact posture in which the nozzle section comes into contact with the outer edge of the port section and then operate the pressing part toward the open posture.

17. A load port comprising the gas supply device according to claim 1 in plurality, wherein a gas atmosphere in the target container is capable of being replaced with nitrogen or dry air while the pressing part of the gas supply device is caused to communicate with each of the plurality of the port sections that are provided on a bottom face of the target container.

18. A semiconductor manufacturing apparatus comprising:
the load port according to claim 17;
a semiconductor manufacturing apparatus main body; and
a transfer room that is disposed between the semiconductor manufacturing apparatus main body and the load port; and
the semiconductor manufacturing apparatus is configured to receive the target container and export or import a wafer that is stored in the target container via a conveyance inlet formed on a front face of the target container.

* * * * *